(12) United States Patent
Gardner et al.

(10) Patent No.: US 6,169,006 B1
(45) Date of Patent: Jan. 2, 2001

(54) SEMICONDUCTOR DEVICE HAVING GROWN OXIDE SPACERS AND METHOD OF MANUFACTURE THEREOF

(75) Inventors: Mark I. Gardner, Cedar Creek; H. Jim Fulford; Charles E. May, both of Austin, all of TX (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/124,604

(22) Filed: Jul. 29, 1998

(51) Int. Cl.$^7$ .................................................. H01L 21/336
(52) U.S. Cl. ......................... 438/303; 438/595; 438/585; 438/589; 438/591; 438/305; 438/197
(58) Field of Search ................................ 438/595, 585, 438/589, 591, 305, 303, 197, 300, 306, 683, 685, 299

(56) References Cited

U.S. PATENT DOCUMENTS

| | | | |
|---|---|---|---|
| 4,460,413 | * 7/1984 | Hirata et al. ........................... | 148/1.5 |
| 4,636,834 | * 1/1987 | Shepard ................................ | 357/23.3 |
| 5,372,964 | * 12/1994 | Gotou ...................................... | 437/52 |
| 5,516,708 | * 5/1996 | Li et al. ................................... | 437/31 |
| 5,899,722 | * 5/1999 | Huang ..................................... | 438/305 |
| 5,918,133 | * 6/1999 | Gardner et al. ....................... | 438/299 |
| 5,937,300 | * 8/1999 | Sekine et al. .......................... | 438/300 |
| 5,943,596 | * 8/1999 | Gardner et al. ....................... | 438/585 |
| 5,960,270 | * 9/1999 | Misra et al. ........................... | 438/197 |
| 5,966,597 | * 10/1999 | Wright .................................... | 438/197 |
| 5,966,606 | * 10/1999 | Ono ........................................ | 438/303 |
| 6,046,105 | * 4/2000 | Kittl et al. .............................. | 438/655 |

\* cited by examiner

*Primary Examiner*—Matthew Smith
*Assistant Examiner*—Victor Yevsikov

(57) ABSTRACT

A semiconductor device having grown oxide spacers and a method for manufacturing such a semiconductor device is provided. In one embodiment of the invention, a gate electrode is formed over a substrate, and an oxidation-resistant layer is formed adjacent to the gate electrode. The gate electrode is oxidized to grow an oxide layer on the gate electrode extending over the oxidation-resistant layer. One or more spacers then is formed adjacent to the gate electrode using the oxide layer.

27 Claims, 4 Drawing Sheets

SEMICONDUCTOR DEVICE HAVING GROWN OXIDE SPACERS AND METHOD OF MANUFACTURE THEREOF

FIELD OF THE INVENTION

The present invention is directed generally to spacers for semiconductor devices and, more particularly, to semiconductor devices having grown oxide spacers and methods of forming such devices.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 is typically a heavily doped conductor having uniform conductivity. An input signal is typically applied to the gate electrode 103 via a gate terminal (not shown). Heavily doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.).

A channel region 107 is formed in the semiconductor substrate 101 beneath the gate electrode 103 and separates the source/drain regions 105. The channel is typically lightly doped with a dopant type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107. Spacers 113 are generally formed on sidewalls of the gate electrode 103 and silicidation layers 111 are formed over the source/drain regions 105. The spacers 113 play an important role in semiconductor devices. The spacers 113 separate the silicidation layer 111 over the source/drain regions 105 from the silicidation layer 111 on the gate electrode 103. Without the spacers 113, conventionally formed silicidation layers would short the source/drain regions 105 and the gate electrode 103. The spacers 113 also play an important role in the formation of the source/drain regions 108. For example, spacers 113 are commonly used to space implants from the gate electrode 103.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner an electric field controls the current flow through the channel region 107. This type of device is commonly referred to as a MOS field-effect-transistor (MOSFET).

Semiconductor devices, like the one described above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral as well as vertical dimensions of the device structure. In scaling down the semiconductor devices, the spacers must also be controllably scaled down.

SUMMARY OF THE INVENTION

The present invention generally provides a semiconductor device having grown oxide spacers and a method for manufacturing such a semiconductor device. The spacers may be formed by oxidation using an oxidation-resistant layer which improves the reliability of the device.

In one embodiment of the invention, a gate electrode is formed over a substrate, and an oxidation-resistant layer is formed adjacent to the gate electrode. The gate electrode is then oxidized to form an oxide layer extending over the oxidation-resistant layer. One or more spacers is then formed adjacent to the gate electrode using the oxide layer.

The above summary of the present invention is not intended to describe each embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
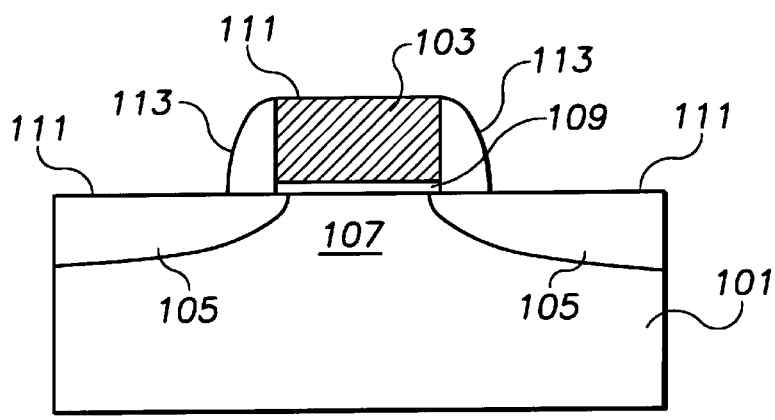
FIG. 1 illustrates one typical MOS semiconductor device structure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a number of semiconductor devices, including in particular MOS devices, which make use of spacers. The invention is particularly suited to those devices which benefit from thin-spacers. While the present invention is not so limited, an appreciation of various aspects of the invention will be gained through a discussion of the fabrication process and characteristics of such devices in connection with the examples provided below.

Figure 2A:
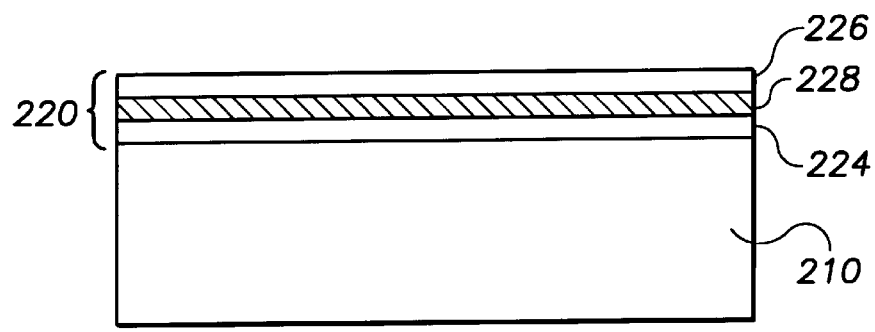
FIGS. 2A–2F illustrate an exemplary fabrication process in accordance with one embodiment of the invention.

FIGS. 2A–2F illustrate one embodiment of a process for fabricating a semiconductor device. In this exemplary embodiment, a stack 220 of dielectric layers is formed over a substrate 210 such as silicon. The stack 220 typically includes a barrier layer 224, an oxidation-resistant layer 228, and a dielectric layer 226, as depicted in FIG. 2A. The layers, 224, 226, and 228, included in the stack 220 of layers may be formed using a variety of materials and may be formed by a variety of methods.

The barrier layer 224 typically prevents or restrains interaction, for example, chemical reaction or diffusion of ions or atoms, between the oxidation-resistant layer 228 and the substrate 210. The barrier layer 224 is often formed from dielectric materials, such as, for example, oxides or oxynitrides, including, silicon dioxide ($SiO_2$) or silicon oxynitride ($SiO_xN_y$). The barrier layer 224 can be formed by, for example, thermal oxidation, chemical vapor deposition or physical vapor deposition. The thickness of the barrier layer 224 can range, for example, from 100 to 300 angstroms, although thicker or thinner barrier layers may be used. In some embodiments typically where the oxidation-resistant layer 228 interacts well with the substrate 210, the barrier layer 224 may be omitted.

Figure 2B:
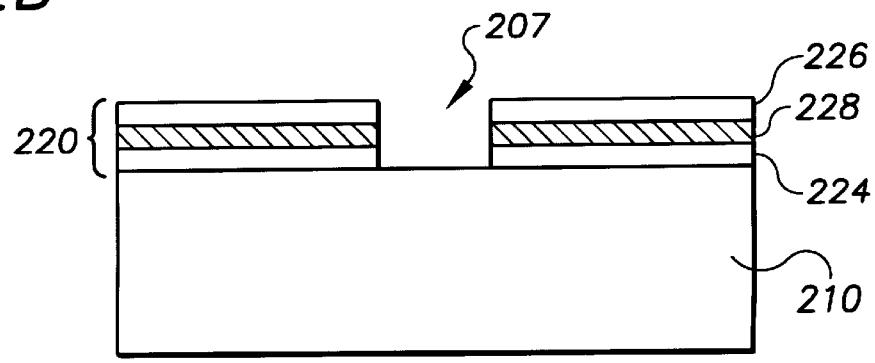
Figure 2C:
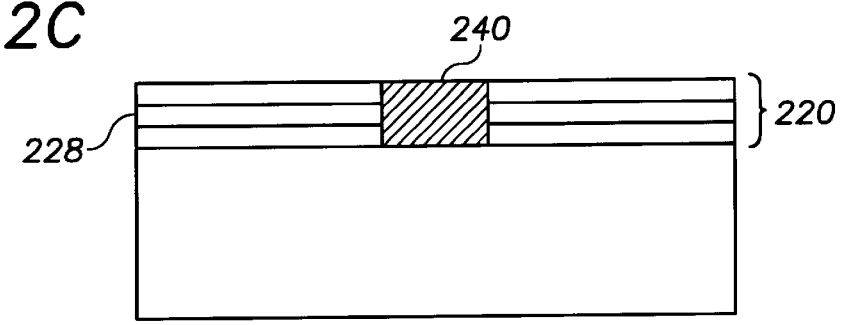
Figure 2D:
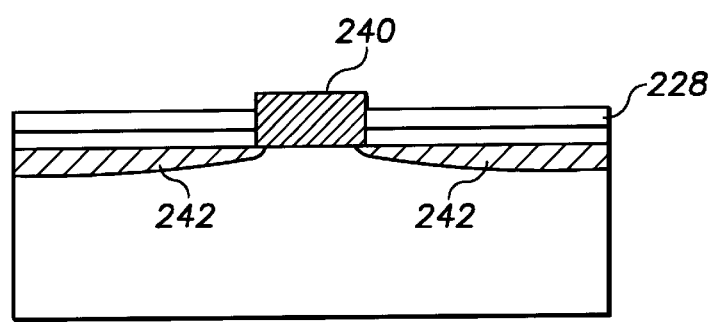
Figure 2E:
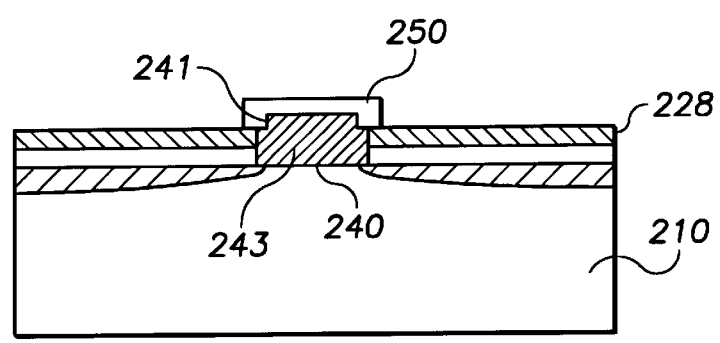

The oxidation-resistant layer 228 protects the substrate 210 and a lower portion of the gate electrode 240 from oxidation during the formation of an oxide layer 250 (see FIG. 2E). The oxidation-resistant layer 228 is typically formed using a material that is resistant to an oxidation process used to form the oxide layer 250. Suitable materials include, for example, nitrides such as silicon nitride or silicon oxynitride. The oxidation-resistant layer 228 can be formed using a number of techniques including, for example, chemical vapor deposition or physical vapor deposition. The thickness of the oxidation-resistant layer 228 can range, for example, from 100 to 500 angstroms, although thicker or thinner oxidation-resistant layers may be used depending, in part, on the thickness of the gate electrode 240 (see FIG. 2C) and the barrier layer 224.

The dielectric layer 226 is provided to assist in forming and later exposing a portion of a gate electrode 240 (see FIG. 2C) for oxidation. The dielectric layer 226 is typically formed from dielectric materials, particularly those materials that can be selectively etched with respect to the oxidation-resistant layer 228. The dielectric layer 226 can be an oxide such as silicon dioxide, for example. The dielectric layer 226 can be formed using a number of techniques including, for example, chemical vapor deposition or physical vapor deposition. The thickness of the top oxide dielectric layer 226 can range, for example, from 1,200 to 1,800 angstroms, although thicker or thinner dielectric layers may be used depending, in part, on the thickness of the gate electrode 240 and the underlying layers, 224, 228.

After the stack 220 of layers is formed, one or more openings 207 are formed in the stack 220 by removing a portion of the stack of layers, as shown in FIG. 2B. The opening 207 may vary in dimensions, depending on the device to be manufactured and the desired size of the gate electrode 240 (FIG. 2C). The opening 207 can be formed using techniques such as, for example, photolithography and patterned etching.

Often the opening extends completely through the stack 220 of layers to the substrate 210, as shown in FIG. 2B. In other embodiments, however, a portion of the barrier layer may be left beneath the opening to act as a thin gate insulating layer. If the opening 207 extends to the substrate 210, then a gate insulating layer is formed in the opening 207 over the substrate 210. The gate insulating layer, which acts as an insulator between the gate electrode 240 and the substrate 210, can be formed using a variety of dielectric materials, including, for example, oxides and oxynitrides, such as silicon dioxide and silicon oxynitride. The gate insulating layer can be formed by a variety of techniques, including, for example, thermal oxidation, chemical vapor deposition, and physical vapor deposition. The thickness of the gate insulating layer can range from, for example, 10 angstroms to 50 angstroms. If a portion of the barrier layer is left for use as the gate insulating layer, the thickness of that portion can be increased by, for example, chemical vapor deposition or physical vapor deposition if desired.

After forming the opening 207 and the gate insulating layer, a gate electrode 240 is formed in the opening 207 and adjacent to the stack 220 of layers. The resultant structure is shown in FIG. 2C. The gate electrode 240 may vary in dimensions, depending on the device to be fabricated. The gate electrode 240 may extend to or beyond the top surface of the stack 220 of dielectric layers. Typically, the gate electrode extends at least beyond a top surface of the oxidation-resistant layer 228. The gate electrode 240 is typically formed from polysilicon. It will be appreciated that to obtain the gate electrode depicted in FIG. 2C a number of different known fabrication techniques could be used including, for example, chemical vapor deposition, low-pressure chemical vapor deposition, and physical vapor deposition. A portion of the gate electrode 240 may be removed to planarize the top surface of the gate electrode. In some embodiments, the top surface of the gate electrode may be made coplanar with the top surface of the stack 220 of layers, as shown in FIG. 2C. Planarization of the gate electrode may be performed by, for example, chemical, mechanical, or chemical-mechanical polishing techniques.

To form the structure depicted as FIG. 2D, the dielectric layer 226 is removed to expose a portion of the gate electrode 240 that extends beyond the top surface of the oxidation-resistant layer 228. Typically, the dielectric layer 226 is removed by, for example, an etching technique selective to the material of the dielectric layer 226. The substrate adjacent the gate electrode 240, may, if desired, then be doped using, for example, ion implantation techniques to form lightly-doped regions 242. In an n-type MOS (NMOS) device, the doped regions 242 are formed using an n-type dopant, such as arsenic or phosphorus, while in a p-type MOS (PMOS), the doped regions 242 are formed using a p-type dopant, such as boron or boron compounds. Implantation energies for this process can range from 50 to 500 keV and dopant concentrations can range from 5E13 ($5 \times 10^{13}$) to 2E15 ($1 \times 10^{15}$) ions/cm$^2$ for many applications. The lightly-doped regions 242 can be used to form lightly-doped drain (LLD) source/drain structures.

An oxide layer 250 is grown on the portion of the gate electrode 240 that extends beyond the top surface of the oxidation-resistant layer 228, as shown in FIG. 2E. The oxide layer 250 may be grown by oxidizing the gate electrode 240 to form the oxide layer 250. This may be performed using a variety of oxidation techniques including chemical oxidation, electrochemical oxidation, and thermal oxidation. Thermal oxidation, in particular, often provides an easily-controlled growth of the oxide layer 250 to a precision, in many cases, of one monolayer of oxide. The type of oxide layer 250 can vary depending on the oxidation environment and may be, for example, silicon dioxide or silicon oxynitride. Suitable thicknesses of the oxide layer 250 range from 20 to 300 angstroms for many applications. The resulting thickness of the oxide layer 250 disposed on the upper sidewalls of the gate electrode 240 typically defines the thickness of the spacers 260 (FIG. 2F).

Since the oxidation-resistant layer 228 is adjacent to the gate electrode 240, oxide growth along the portion of the gate electrode 240 that is beneath the top surface of the oxidation-resistant layer 228 is substantially inhibited. The use of the oxidation-resistant layer 228 to protect the lower portions of the gate electrode 240 from oxidation prevents or restricts the deformation of the gate electrode 240 due to the oxide growth between the underlying gate electrode 240 and the gate insulating layer. The oxidation-resistant layer 228 may also serve to protect the substrate 210. During the oxidation, a portion of the gate electrode 240 is removed. As a result an upper portion 241 of the gate electrode 240 is typically recessed with respect to a lower portion 243 of the gate electrode 240 adjacent the oxidation-resistant layer 228.

Figure 2F:
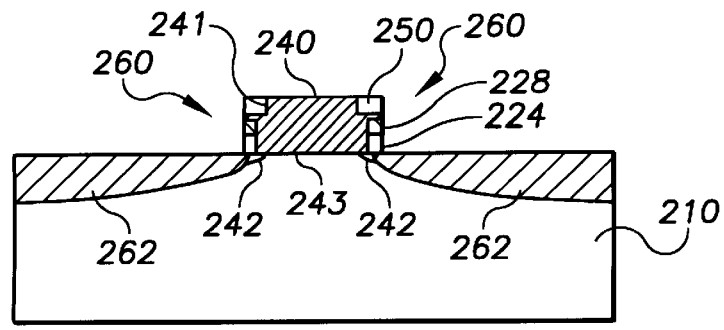

Spacers 260 can be formed on sidewalls of the gate electrode 240 by removing portions of the stack of layers 220 not beneath the oxide layer 250, as shown in FIG. 2F. The resulting spacers 260 include a portion of the oxide layer 250, a portion of the oxidation-resistant layer 228, and a portion of the barrier layer 224. The oxide layer portion of the spacers 260 typically fills the recess between the upper and lower portions 241 and 243 of the gate electrode 240. The thickness of the spacers 260 typically depends, at least in part, on the thickness of the oxide layer 250; and the height of the spacers 260 typically depends, at least in part, on the height of the gate electrode 240. To form the spacers 260, a portion of the oxidation-resistant layer 228 can be, for example, selectively removed by an anisotropic nitride etch to leave a remaining portion underneath the oxide layer 250. A portion of the barrier layer 224 can then be removed by, for example, an anisotropic oxide etch to leave a remaining portion underneath the oxide layer 250. The anisotropic oxide etch may also remove a portion of the oxide layer 250 disposed over the gate electrode 240. In other embodiments, the spacers may contain a variety of layers, depending on the layers that were included in the stack of layers. For example, the spacers may include only an oxide layer portion and a oxidation-resistant layer portion.

Fabrication may continue with conventional processing steps to form a complete device structure. For example, the device may be further doped, for example, by ion implantation, to form heavily-doped regions 262 in the substrate 210, as shown in FIG. 2F. The heavily-doped regions 262 and lightly-doped regions 242 may operate as LLD source/drain regions. In a PMOS device, the heavily-doped regions 262 are formed from a p-type dopant. While in an NMOS device, the heavily-doped regions 262 are formed from an n-type dopant. Implantation energies for this process can range from 2 to 50 keV and dopant concentrations can range from 1E15 to 1E16 ions/cm$^2$ for many applications. In addition, a silicidation layer may be formed over the source/drain regions and gate electrode(s) to prepare these structures for contacts.

Figure 3A:
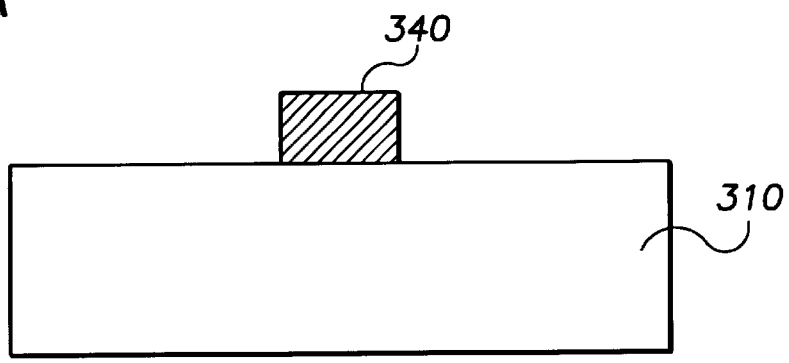
FIGS. 3A–3C illustrate another exemplary fabrication process in accordance with another embodiment of the invention.
Figure 3B:
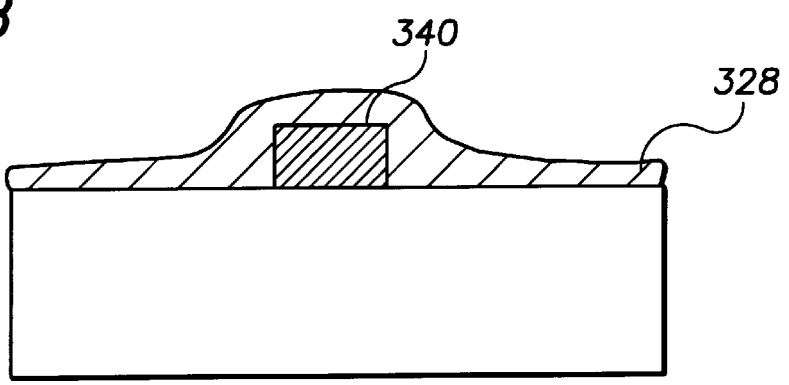
Figure 3C:
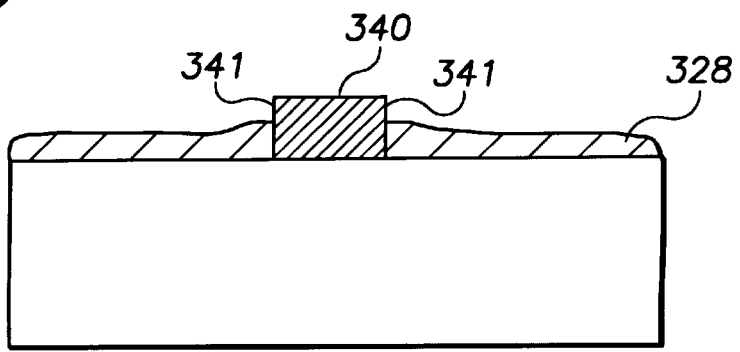

FIGS. 3A–3C illustrate another process for forming grown oxide spacers adjacent a gate electrode. In this embodiment, a gate electrode 340 is formed over a substrate 310, as shown in FIG. 3A. A gate insulating layer (not shown) is formed typically between the gate electrode 340 and the substrate 310. The gate electrode 340 and gate insulating layer may be formed using a variety of well-known techniques. A low dose of a dopant may be implanted at this time to form lightly-doped regions if desired.

An oxidation-resistant layer 328 is then formed over the gate electrode 340 and the substrate 310 as shown in FIG. 3B. The oxidation-resistant layer 328 may be formed by known techniques, such as, for example, physical vapor deposition, chemical vapor deposition, or low-pressure chemical vapor deposition. An optional barrier layer may be formed over the substrate 310 prior to forming the oxidation-resistant layer 328 if desired. The thickness of the oxidation-resistant layer 328 can vary and may be greater or less than the thickness of the gate electrode 340. A portion of the oxidation-resistant layer 328 is then removed to expose upper sidewall portions 341 of the gate electrode 340. The resultant structure is shown in FIG. 3C. This may, for example, be done by selectively removing the oxidation-resistant layer 328, using techniques such as chemical, mechanical, chemical/mechanical polishing and/or selective etching while leaving the gate electrode 340 intact. Fabrication may then continue with the processing described above with respect to FIGS. 2E and 2F to form grown oxide spacers adjacent sidewalls of the gate electrode 340.

Figure 4A:
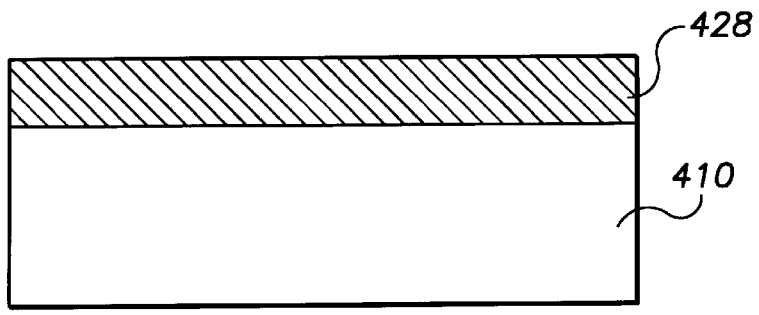
FIG. 4A–4C illustrate an exemplary fabrication process in accordance with yet another embodiment of the invention.
Figure 4B:
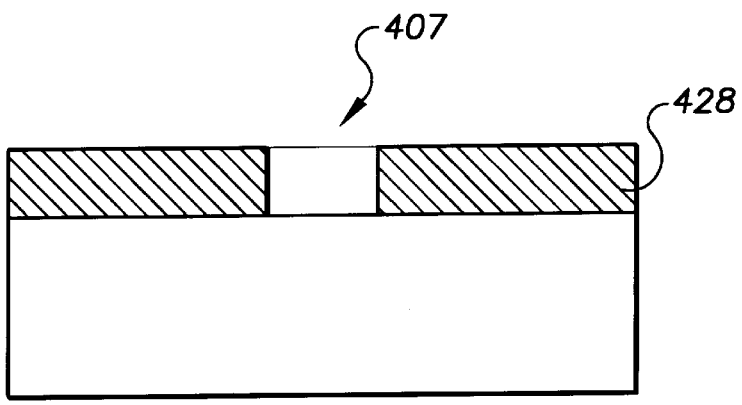
Figure 4C:
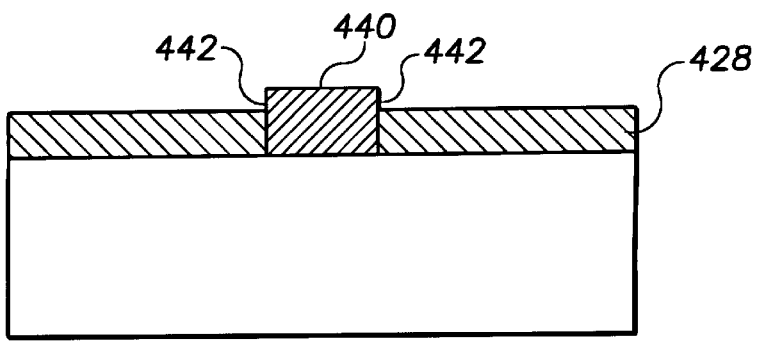

FIGS. 4A–4C illustrate another exemplary process for forming grown oxide spacers with an oxidation-resistant layer. In this embodiment, an oxidation-resistant layer 428 is formed over a substrate 410. The resultant structure is illustrated in FIG. 4A. The oxidation-resistant layer may be formed from a number of different materials using a number of different techniques, as discussed above. Optionally, a barrier layer may be formed over the substrate 410 prior to forming the oxidation-resistant layer 428.

One or more openings (only one of which is shown) are then formed in the oxidation-resistant layer 428, as illustrated in FIG. 4B. The opening 407 will be used to form a gate electrode. The thickness of the oxidation-resistant layer 428 (or combination of oxidation-resistant layer 428 and barrier layer) is typically selected in consideration of the desired height of a gate electrode. The width of the opening 407 is typically selected in consideration of the desired width of the gate electrode. The opening 407 may be formed using well-known techniques such as masking and etching, for example.

A gate electrode 440 is then formed in the opening 407. This may be done, for example, by depositing a layer of polysilicon and planarizing the polysilicon layer with the upper surface of the oxidation-resistant layer 428. The deposition and planarization may be performed using, for example, well-known deposition and chemical-mechanical polishing techniques. An upper portion of the oxidation-resistant layer 428 is then removed to expose upper sidewall portions 442 of the gate electrode 440. The result instructure is illustrated in FIG. 4C. The oxidation-resistant layer 428 may be selectively removed while keeping the gate electrode 440 intact using a number of techniques, such as selectively etching or polishing the oxidation-resistant layer using etchants which are selective to the material of the gate electrode 440. Fabrication may continue with the processing as described above with respect to FIGS. 2E and 2F to oxidize the portions 442 of the gate electrode 440 extending above the oxidation-resistant layer 428 and form grown oxide spacers on sidewalls of the gate electrode 440.

The above processes describe a number of different techniques for forming grown oxide spacers adjacent sidewalls of a gate electrode. The above processes, through the use of an oxidation-resistant layer, allow the formation of grown oxide spacers without damaging the gate electrode or the substrate. This allows for further scaling of semiconductor devices and further increases in device performance and reliability.

The above process can be used to form a number of different semiconductor devices, including but not limited to MOS structures such as PMOS devices, NMOS devices, complimentary MOS (CMOS) semiconductor devices having both PMOS and NMOS devices and bipolar CMOS (BiCMOS) devices. In a CMOS device, for example, the NMOS device regions may be masked off while the above process is carried out on the PMOS device regions and the PMOS device regions may be masked off while the above process is carried out on the NMOS device regions. Alternatively, fabrication of the NMOS and PMOS device regions may occur simultaneously, with masking typically used only during the dopant implantation steps. For example, during the dopant implantation of the device region(s) of the NMOS region, the PMOS region is masked, and vice versa.

Moreover, it should be appreciated that while the formation of LLD source/drain regions are shown in exemplary embodiments, the invention is not limited to any particular type of source/drain region or techniques for forming such regions. Dopant implants for forming source/drain regions may vary and/or be performed at different stages in the above process. For instance, low dose implants for forming lightly doped regions may be omitted.

As noted above, the present invention is applicable to the fabrication of a number of semiconductor devices, including in particular MOS structures. Accordingly, the present invention should not be considered limited to the particular examples described above, but rather should be understood to cover all aspects of the invention as fairly set out in the accompanying claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process for forming a semiconductor device, comprising:
    forming a gate electrode over a substrate;
    forming an oxidation-resistant layer adjacent to the gate electrode;
    forming an opening in the oxidation-resistant layer, wherein the gate electrode is formed in the opening;
    oxidizing the gate electrode to form an oxide layer that extends over the oxidation-resistant layer; and
    forming one or more spacers adjacent to the gate electrode using a portion of the oxide layer and the oxidation-resistant layer, such that the oxide and oxidation-resistant layer portions are in contact with the gate electrode.

2. The process of claim 1, further comprising forming a barrier layer on the substrate before forming the oxidation-resistant layer.

3. The process of claim 2, wherein a portion of the barrier layer forms part of the spacer and is in contact with the gate electrode.

4. The process of claim 3, wherein the spacer is formed with a top, middle and bottom portion, wherein the top portion includes the oxide layer, the middle portion includes the oxidation-resistant layer and the bottom portion includes the barrier layer.

5. The process of claim 4, wherein the gate electrode is formed from polysilicon and the oxide layer is formed from the upper sidewall portions of the gate electrode, the oxide layer protruding into the polysilicon gate electrode such that the top surface of the gate electrode is reduced.

6. The process of claim 1, further comprising, after forming the gate electrode in the opening exposing upper sidewall portions of the gate electrode.

7. The process of claim 6, wherein oxidizing includes oxidizing the upper sidewall portions of the gate electrode.

8. The process of claim 1, wherein oxidizing includes oxidizing a portion of the gate electrode that extends beyond a top surface of the oxidation-resistant layer.

9. The process of claim 8, wherein oxidizing a portion of the gate electrode includes thermally oxidizing the portion of the gate electrode that extends beyond the top surface of the oxidation-resistant layer.

10. The process of claim 1, wherein the oxidation-resistant layer includes a nitrogen-containing material.

11. The process of claim 10, wherein the nitrogen-containing material includes material selected from the group consisting of silicon oxynitride and silicon nitride.

12. The process of claim 1, wherein forming the oxidation-resistant layer include depositing the oxidation-resistant layer over the gate electrode.

13. The process of claim 12, further comprising removing a portion of the oxidation-resistant layer to expose upper sidewall portions of the gate electrode.

14. The process of claim 13, wherein oxidizing further includes oxidizing the upper sidewall portions of the gate electrode.

15. A process for forming a semiconductor device, comprising:
    forming an oxidation-resistant layer over a substrate;
    forming a dielectric layer over the oxidation-resistant layer;
    forming an opening in the dielectric layer and oxidation-resistant layer;
    forming a gate electrode in the opening;
    removing the dielectric layer to expose a portion of the gate electrode extending over the oxidation-resistant layer;
    oxidizing the upper portion of the gate electrode to form an oxide layer without substantially oxidizing the lower portion of the gate electrode below the oxidation-resistant layer; and
    forming one or more spacers adjacent to the gate electrode using the oxide layer.

16. The process of claim 15, further including forming a barrier layer over the substrate prior to forming the oxidation-resistant layer.

17. The process of claim 16, wherein the spacers are composite members formed from portions of the oxide and the oxidation-resistant layers, such that the oxide and oxidation-resistant layer portions are in contact with the gate electrode, and wherein a portion of the barrier layer forms part of the composite members and is in contact with the gate electrode.

18. The process of claim 17, wherein the spacer is formed with a top, middle and bottom portion, wherein the top portion includes the oxide layer, the middle portion includes the oxidation-resistant layer and the bottom portion includes the barrier layer.

19. The process of claim 18, wherein the gate electrode is formed from polysilicon and the oxide layer is formed from the upper sidewall portions of the gate electrode, the oxide layer protruding into the polysilicon gate electrode such that the top surface of the gate electrode is reduced.

20. A process for forming a semiconductor device, comprising:
    forming an initial oxidation-resistant layer over a substrate;
    removing a portion of the initial oxidation-resistant layer to form an opening;

forming a gate electrode in the opening with an oxidation-resistant layer adjacent to the gate electrode;

oxidizing the gate electrode to form an oxide layer that extends over the oxidation-resistant layer; and forming at least one composite spacer adjacent to the gate electrode using a portion of the oxide layer and the oxidation-resistant layer, such that the oxide and oxidation-resistant layer portions are in contact with the gate electrode.

21. The process of claim 20, wherein the opening extends to the substrate.

22. The process of claim 20, further comprising forming a gate insulating layer in the opening before forming the gate electrode.

23. The process of claim 20, further including removing a top portion of the initial oxidation-resistant layer to form the oxidation-resistant layer adjacent to the gate electrode and to expose a portion of the gate electrode that extends beyond a top surface of the oxidation-resistant layer.

24. The process of claim 20, further including forming a barrier layer over the substrate prior to forming the oxidation-resistant layer.

25. The process of claim 24, wherein a portion of the barrier layer forms part of the spacers and is in contact with the gate electrode.

26. The process of claim 25, wherein the spacer is formed with a top, middle and bottom portion, wherein the top portion includes the oxide layer, the middle portion includes the oxidation-resistant layer and the bottom portion includes the barrier layer.

27. The process of claim 26, wherein the gate electrode is formed from polysilicon and the oxide layer is formed from the upper sidewall portions of the gate electrode, the oxide layer protruding into the polysilicon gate electrode such that the top surface of the gate electrode is reduced.

* * * * *

UNITED STATES PATENT AND TRADEMARK OFFICE
CERTIFICATE OF CORRECTION

PATENT NO.    : 6,169,006 B1
DATED         : January 2, 2001
INVENTOR(S)   : Gardner et al.

It is certified that error appears in the above-identified patent and that said Letters Patent is hereby corrected as shown below:

Column 5,
Line 11, "the gate" should read -- the underlying gate --.

Signed and Sealed this

Eleventh Day of February, 2003

JAMES E. ROGAN
*Director of the United States Patent and Trademark Office*